US006770540B2

(12) United States Patent
Ko (10) Patent No.: US 6,770,540 B2
(45) Date of Patent: Aug. 3, 2004

(54) METHOD OF FABRICATING SEMICONDUCTOR DEVICE HAVING L-SHAPED SPACER

(75) Inventor: Young-gun Ko, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/103,864

(22) Filed: Mar. 25, 2002

(65) Prior Publication Data

US 2003/0027414 A1 Feb. 6, 2003

(30) Foreign Application Priority Data

Aug. 2, 2001 (KR) .................................... 2001-0046804

(51) Int. Cl.[7] .......................................... H01L 21/336
(52) U.S. Cl. ....................... 438/303; 438/566; 438/730
(58) Field of Search ................................ 438/303, 305,
438/306, 366, 566, 595, 730, FOR 193,
FOR 188; 257/E29.012, E29.266

(56) References Cited

U.S. PATENT DOCUMENTS

| | | | | |
|---|---|---|---|---|
| 5,783,475 | A | | 7/1998 | Ramaswami ................ 438/303 |
| 6,180,472 | B1 | * | 1/2001 | Akamatsu et al. .......... 438/303 |
| 6,281,084 | B1 | * | 8/2001 | Akatsu et al. .............. 438/301 |
| 6,312,998 | B1 | * | 11/2001 | Yu ............................ 438/303 |
| 6,440,875 | B1 | * | 8/2002 | Chan et al. ................. 438/778 |
| 6,448,167 | B1 | * | 9/2002 | Wang et al. ................ 438/595 |
| 6,506,652 | B2 | * | 1/2003 | Jan et al. .................... 438/303 |
| 6,508,650 | B2 | * | 1/2003 | Gittleman ................... 433/172 |
| 6,541,328 | B2 | * | 4/2003 | Whang et al. .............. 438/231 |

* cited by examiner

Primary Examiner—George Fourson
Assistant Examiner—Fernando L. Toledo
(74) Attorney, Agent, or Firm—Harness, Dickey & Pierce, PLC

(57) ABSTRACT

A method of fabricating a semiconductor device having an L-shaped spacer is provided. A buffer dielectric layer, a first dielectric layer, and a second dielectric layer are sequentially formed on the surface of the gate electrode and on the semiconductor substrate. Next, the second dielectric layer is etched to form a first disposable spacer on the first dielectric layer at both sidewalls of the gate electrode. Next, a deeply doped source and drain region is formed on the semiconductor substrate to be aligned to the first disposable spacer. Next, the first disposable spacer and the first dielectric layer are sequentially removed. Next, a shallowly doped source and drain region is formed on the semiconductor substrate at both sidewalls of the gate electrode adjacent to the deeply doped source and drain region. Next, a third dielectric layer, a fourth dielectric layer, and a fifth dielectric layer are sequentially formed on the buffer dielectric layer. Next, the fifth dielectric layer is etched to form a second disposable spacer on the fourth dielectric layer at both sidewalls of the gate electrode. Next, the fourth dielectric layer, the third dielectric layer, and the buffer dielectric layer are etched to form an L-shaped spacer at both sidewalls of the gate electrode. Last, a metal silicide is formed on top of the gate electrode and on the deeply doped source and drain region.

22 Claims, 6 Drawing Sheets

METHOD OF FABRICATING SEMICONDUCTOR DEVICE HAVING L-SHAPED SPACER

BACKGROUND OF THE INVENTION

1. Field of the Invention

The present invention relates to a method of fabricating a semiconductor device, and more particularly, to a method of fabricating a semiconductor device having an L-shaped spacer.

2. Description of the Related Art

In general, spacers are formed at both sidewalls of a gate electrode to provide an implant mask for forming a source and drain region and to provide electrical isolation between the gate electrode and the source and drain electrodes during silicide processing. Here, a conventional method of fabricating a semiconductor device having an L-shaped spacer will be described with reference to U.S. Pat. No. 5,783,475 by Motorola, Inc., Shrinath Ramaswami, entitled "Method of Forming a Spacer".

FIGS. 1 through 5 illustrate a conventional method of fabricating a semiconductor device having an L-shaped spacer.

Figure 1:
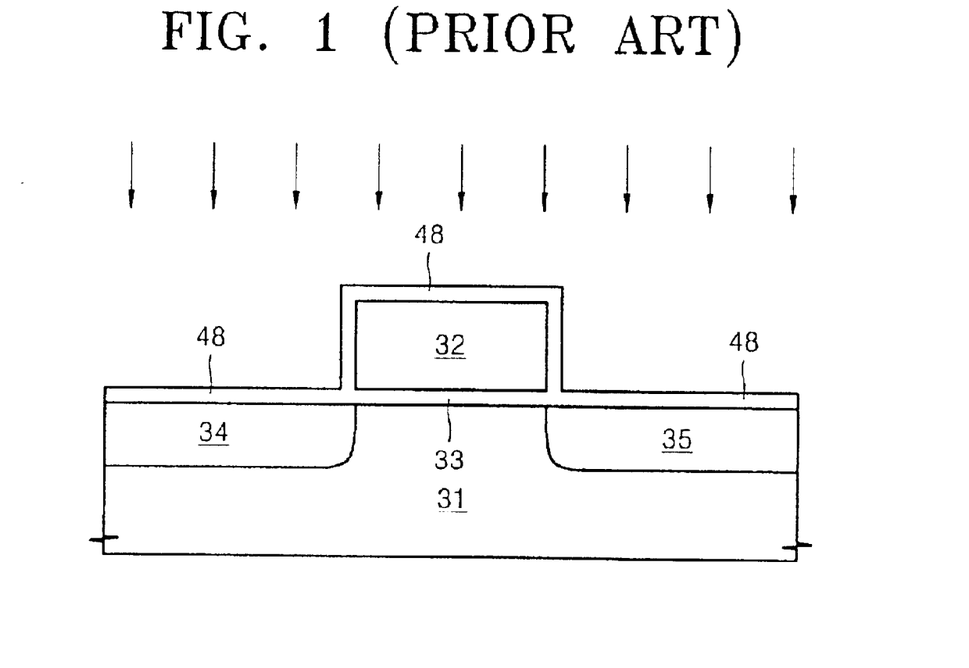
FIGS. 1 through 5 illustrate a conventional method of fabricating a semiconductor device having an L-shaped spacer.

Referring to FIG. 1, a gate dielectric layer 33 is formed on a semiconductor substrate 31, for example, a silicon substrate. Subsequently, a gate electrode 32 is formed on the gate dielectric layer 33. The gate dielectric layer 33 is formed of silicon oxide ($SiO_2$) or silicon nitride ($Si_3N_4$), and the gate electrode 32 is formed of polysilicon. Subsequently, a first dielectric layer 48 is formed on the surface of the gate electrode 32 and on the semiconductor substrate 31. The first dielectric layer 48 is formed of silicon oxide ($SiO_2$). Next, a shallowly doped source region 34 and a shallowly doped drain region 35 are formed in the semiconductor substrate 31 on both sides of the gate electrode 32 by implanting impurities in the entire surface of the semiconductor substrate 31, on which the gate electrode 32 and the first dielectric layer 48 are formed.

Figure 2:
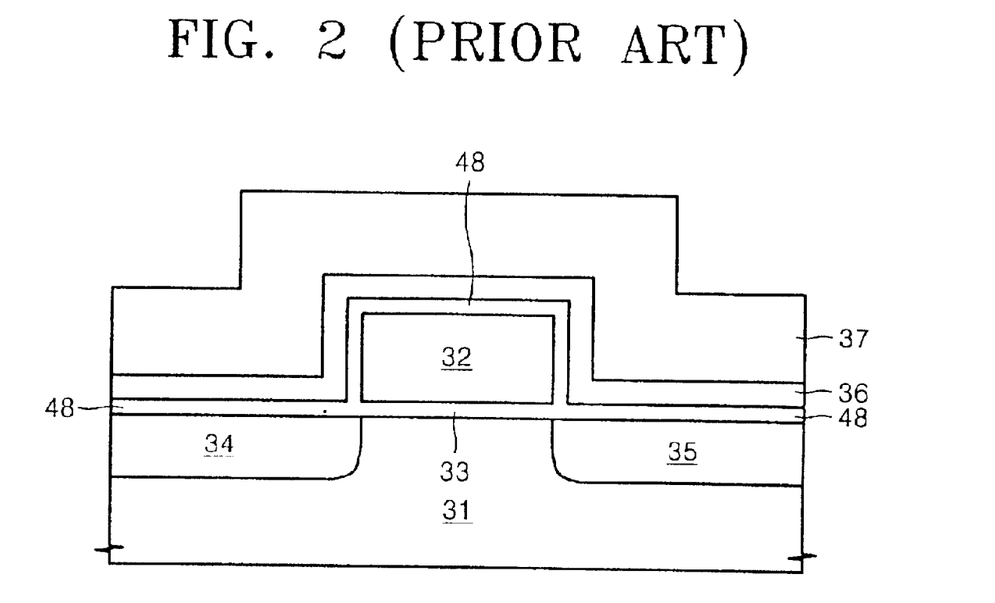

Referring to FIG. 2, a second dielectric layer 36 and a third dielectric layer 37 are formed on the first dielectric layer 48 to form spacers. The second dielectric layer 36 is formed of silicon nitride ($Si_3N_4$), and the third dielectric layer 37 is formed of silicon oxide ($SiO_2$).

Figure 3:
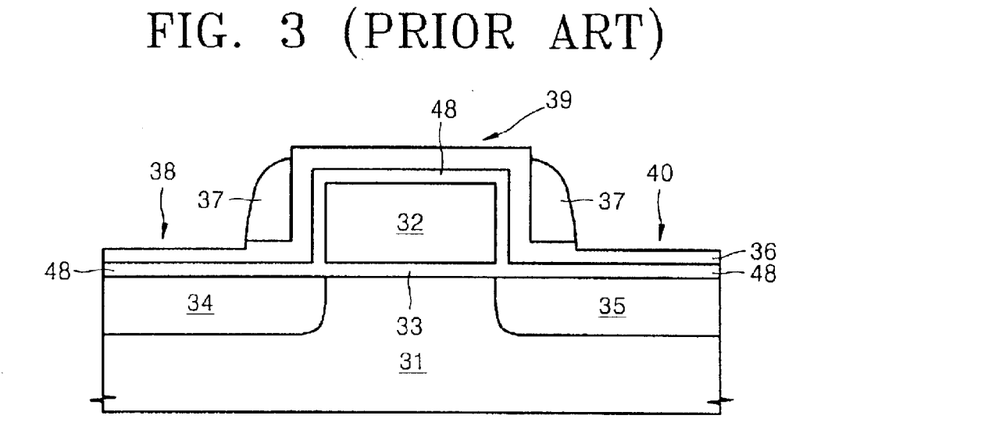

Referring to FIG. 3, the third dielectric layer 37 is anisotropically etched to form a first spacer 37 at both sidewalls of the gate electrode 32. The shallowly doped source region 34, the shallowly doped drain region 35, and the second dielectric layer 36 formed on the gate electrode 32 are exposed at portions marked by reference numerals 38, 40, and 39, respectively.

Figure 4:
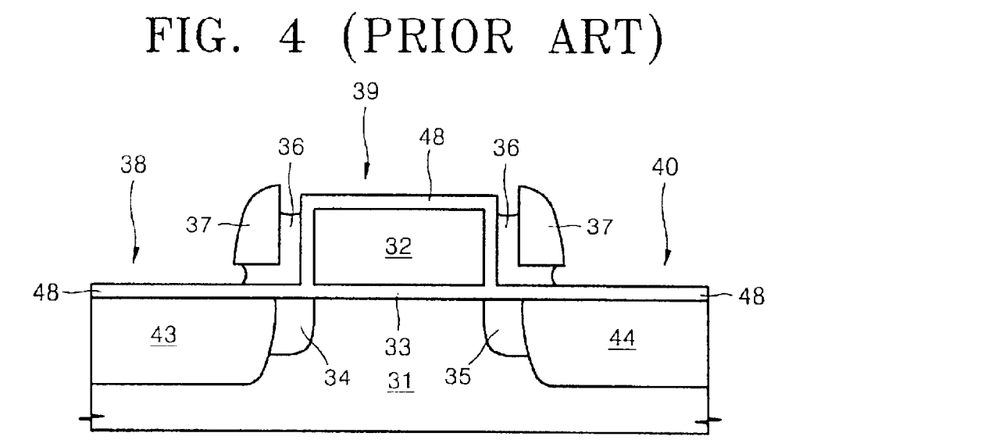

Referring to FIG. 4, the second dielectric layer 36 formed on the shallowly doped source region 34, the shallowly doped drain region 35, and the second dielectric layer 36 on the gate electrode 32 at portions marked by reference numerals 38, 40, and 39, respectively, are etched to form a second spacer 36 at both sidewalls of the gate electrode 32. Etching the second dielectric layer 36 is performed by a wet etch using phosphoric acid, and portions masked by the third dielectric layer 37 and the first dielectric layer 48 are not etched. Subsequently, impurities are implanted in the entire surface of the semiconductor substrate 31 by using the first spacer 37 and the second spacer 36 as a mask and then annealed to form a deeply doped source region 43 and a deeply doped drain region 44. As a result, a source and drain extension is formed of the shallowly doped source region 34 and the shallowly doped drain region 35 adjacent to the deeply doped source region 43 and the deeply doped drain region 44.

Figure 5:
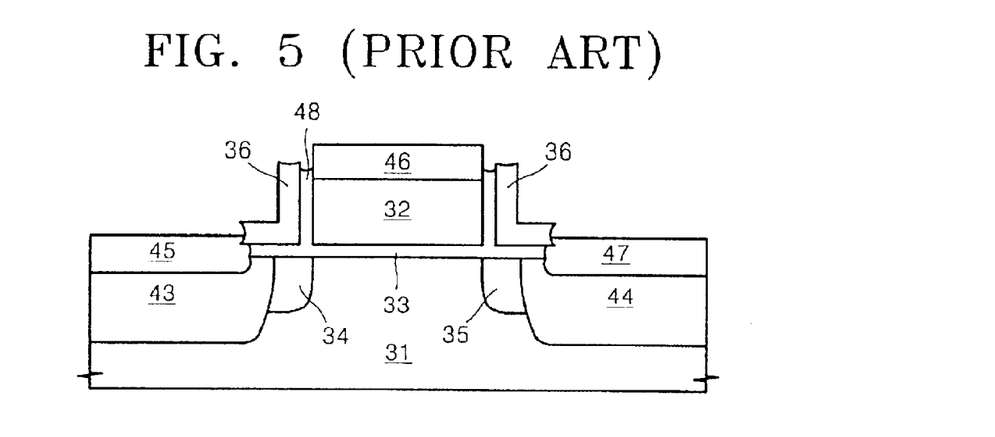

Referring to FIG. 5, the first spacer 37, and the first dielectric layer 48 formed on the deeply doped source region 43 and the deeply doped drain region 44 and the gate electrode 32 are removed at portions marked by reference numerals 38, 40, and 39. Etching the first dielectric layer 48 is performed by using hydrofluoric (HF) solution. In this case, surfaces of the gate electrode 32 and the deeply doped source region 43 and the deeply doped drain region 44 are exposed. Subsequently, salicide contacts 45, 46, and 47 are formed on the deeply doped source region 43, the gate electrode 32, and the deeply doped drain region 44, respectively.

In the conventional method of fabricating a semiconductor device, impurities, which are necessarily shallowly doped during an annealing process for forming the deeply doped source region 43 and deeply doped drain region 44, are spread over the shallowly doped source region 34 and the shallowly doped drain region 35. In such a case, a short channel effect occurs in a highly integrated semiconductor device.

SUMMARY OF THE INVENTION

To solve the above problems, it is an objective of the present invention to provide a method of fabricating a semiconductor device having an L-shaped spacer which is capable of preventing a short channel effect.

Accordingly, to achieve the objective, there is provided a method of fabricating a semiconductor device. A gate dielectric layer and a gate electrode are formed on a semiconductor substrate, and a buffer dielectric layer, a first dielectric layer, and a second dielectric layer are sequentially formed on the surface of the gate electrode and on the semiconductor substrate. The second dielectric layer is etched to form a first disposable spacer on the first dielectric layer at both sidewalls of the gate electrode, and a deeply doped source and drain region is formed on the semiconductor substrate to be aligned to the first disposable spacer.

The first disposable spacer and the first dielectric layer are sequentially removed, and a shallowly doped source and drain region is formed on the semiconductor substrate at both sidewalls of the gate electrode adjacent to the deeply doped source and drain region. A third dielectric layer, a fourth dielectric layer, and a fifth dielectric layer are formed on the buffer dielectric layer, and the fifth dielectric layer is etched to form a second disposable spacer on the fourth dielectric layer at both sidewalls of the gate electrode. The fourth dielectric layer, the third dielectric layer, and the buffer dielectric layer are etched to form an L-shaped spacer at both sidewalls of the gate electrode, and a metal silicide is formed on top of the gate electrode and on the deeply doped source and drain region.

The second dielectric layer is formed of a layer having a high etching selectivity to the first dielectric layer. For example, the second dielectric layer is formed of silicon oxide ($SiO_2$), and the first dielectric layer is formed of silicon nitride ($Si_3N_4$). The first dielectric layer is formed of a layer having a high etching selectivity to the buffer dielectric layer. For example, the first dielectric layer is formed of silicon nitride ($Si_3N_4$), and the buffer dielectric layer is formed of silicon oxide ($SiO_2$).

The deeply doped source and drain region is formed by performing a step of implanting impurities by using the first disposable spacer as a mask and a step of annealing the implanted impurities. The step of annealing to form the deeply doped source and drain region is performed before the shallowly doped source and drain region is formed. The shallowly doped source and drain region is formed by performing a step of implanting impurities in the entire surface of the semiconductor substrate, on which the buffer dielectric layer is formed, and a step of annealing the implanted impurities. The step of annealing to form the shallowly doped source and drain region is performed before the metal silicide is formed. The step of annealing to form the shallowly doped source and drain region is performed at a low temperature of 500–800° C. or by a rapid thermal annealing method or a spike thermal annealing method at a temperature of 900–1300° C.

The fifth dielectric layer is formed of a layer having a high etching selectivity to the fourth dielectric layer. For example, the fifth dielectric layer is formed of silicon oxide ($SiO_2$), and the fourth dielectric layer is formed of silicon nitride ($Si_3N_4$).

The distance from the sidewalls of the gate electrode to the deeply doped source and drain region is determined by the length of the first disposable spacer, and the distance from the sidewalls of the gate electrode to the metal silicide is determined by the length of the L-shaped spacer.

The L-shaped spacer is formed by performing a step of etching the fourth dielectric layer exposed by the second disposable spacer and a step of etching the buffer dielectric layer and the third dielectric layer exposed by the etched fourth dielectric layer. The fourth dielectric layer is formed of a layer having a high etching selectivity to the third dielectric layer. For example, the fourth dielectric layer is formed of silicon nitride ($Si_3N_4$), and the third dielectric layer and the buffer dielectric layer are formed of silicon oxide ($SiO_2$).

Owing to a semiconductor device having disposable spacers according to the present invention, the deeply doped source and drain region is formed before forming the shallowly doped source and drain region, thereby effectively suppressing a short channel effect in a highly integrated semiconductor device.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art.

In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

FIGS. 6 through 15 illustrate a method of fabricating a semiconductor device having an L-shaped spacer according to the present invention.

Figure 6:
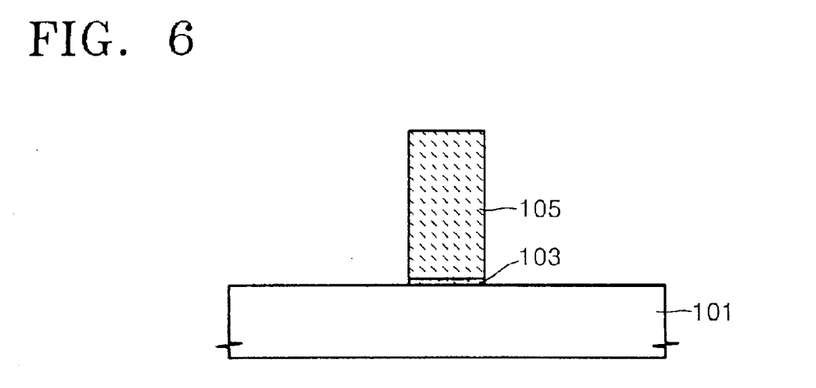
FIGS. 6 through 15 illustrate a method of fabricating a semiconductor device having an L-shaped spacer according to the present invention.
Figure 7:
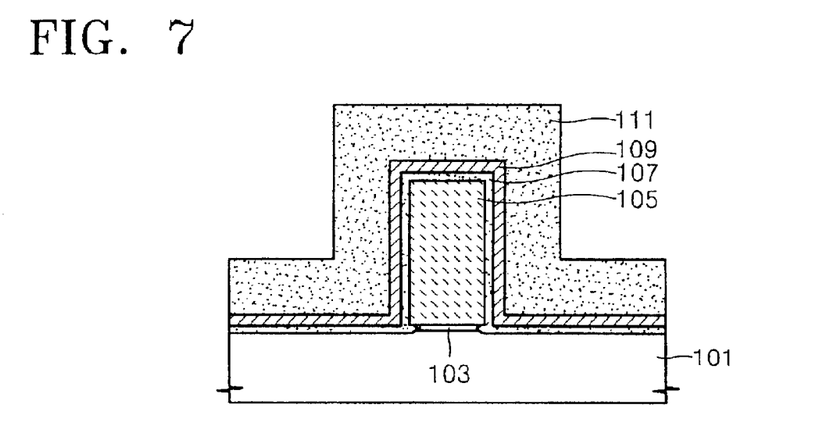

Referring to FIG. 6, a gate dielectric layer 103 is formed on a semiconductor substrate 101, for example, a silicon substrate or a silicon on insulator (SOI). The gate dielectric layer 103 is formed of $SiO_2$, $Si_3N_4$, SiON, $ZrO_2$, $HfO_2$, or $Al_2O_3$. A gate electrode 105 is formed on the gate dielectric layer 103. The gate electrode 105 is formed of polysilicon. As a result, a gate pattern comprised of the gate dielectric layer 103 and the gate electrode 105 is formed. In general, after a dielectric layer and a conductive layer are formed on the semiconductor substrate 101, the dielectric layer and the conductive layer are patterned by using a photolithographic process, thereby forming the gate pattern. The line width of the gate pattern is less than 1 μm in a highly integrated semiconductor device. Referring to FIG. 7, a buffer dielectric layer 107 is formed on the entire surface of the semiconductor substrate 101 on which the gate dielectric layer 103 and the gate electrode 105 are formed. The buffer dielectric layer 107 is formed so as to cure damages in etching when forming the gate pattern. The buffer dielectric layer 107 is formed of silicon oxide ($SiO_2$).

Subsequently, a first dielectric layer 109 is formed on the buffer dielectric layer 107. Preferably, the first dielectric layer 109 is thin such that a deeply doped source and drain region can be easily formed in a subsequent process. Preferably, the first dielectric layer 109 is formed of a material having a high etching selectivity during a subsequent dry or wet etching of silicon oxide ($SiO_2$). In the embodiment, the first dielectric layer 109 is formed of silicon nitride ($Si_3N_4$).

Next, a second dielectric layer 111 for forming a first disposable spacer is formed on the first dielectric layer 109. The second dielectric layer 111 is formed of a material having a high etching selectivity to the first dielectric layer 109. In this embodiment, the second dielectric layer 111 is formed of silicon oxide ($SiO_2$). The length of the first disposable spacer is determined by the thickness of the second dielectric layer 111, and the length from the sidewalls of the gate electrode 105 to the deeply doped source and drain region is determined by the length of the first disposable spacer.

Figure 8:
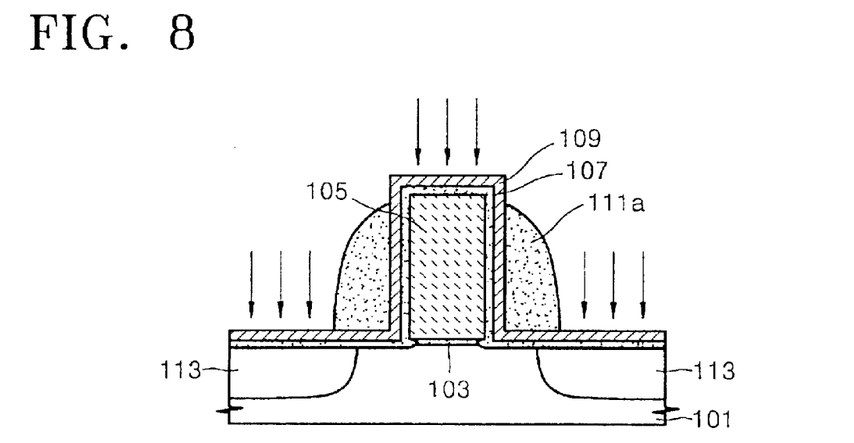

Referring to FIG. 8, the second dielectric layer 111 is dry etched to form a first disposable spacer 111a on a first dielectric layer 109 at both sidewalls of the gate electrode 105. Since the second dielectric layer 111 formed of silicon oxide ($SiO_2$) has a high etching selectivity to the first dielectric layer 109 formed of silicon nitride ($Si_3N_4$), etching of the second dielectric layer 111 stops at the first dielectric layer 109 during the dry etch of the second dielectric layer 111. The second dielectric layer 111 may be overetched.

Subsequently, after impurities with high energy are implanted in the entire surface of the semiconductor substrate 101 (with the gate dielectric 103 and the gate electrode 105 formed thereon) by using the first disposable spacer 111a as a mask, an annealing process is performed so as to activate the implanted impurities. The implanted impurities are P-type impurities or N-type impurities. The annealing process is performed by using a rapid thermal annealing method. In such a case, a deeply doped source and drain region 113 is formed on the semiconductor substrate 101 at both sides of the gate electrode 105 to be aligned to the first disposable spacer 111a. The deeply doped source and drain region 113 is formed prior to forming a shallowly doped source and drain region, that is, a source and drain extension, being formed unlike prior art, as later described. If the deeply doped source and drain region 113 is first formed, the problem of the prior art, that is, impurities spread over a shallowly doped source and drain region, can be prevented.

In the embodiment, the annealing process for forming the deeply doped source and drain region 113 is performed immediately after the implantation of impurities; however, it may be performed before forming the subsequent shallowly doped source and drain region. Further, in the embodiment, the deeply doped source and drain region 113 is formed by using an ion implantation method; however, it may be formed by a solid phase epitaxy method or a plasma doping method.

Figure 9:
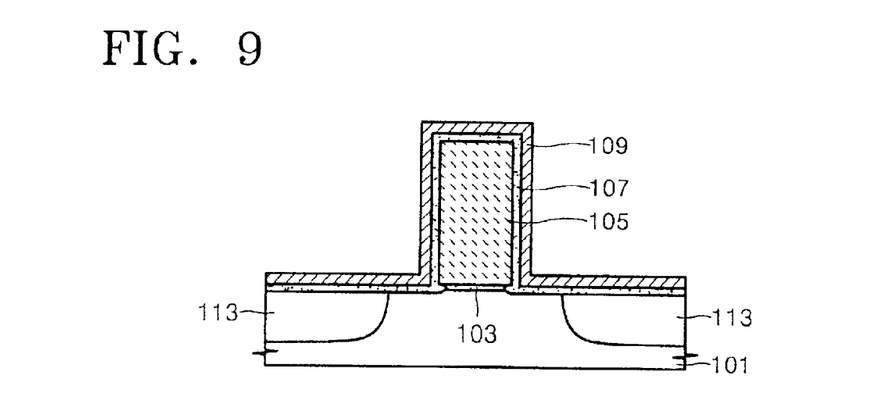

Referring to FIG. 9, the first disposable spacer 111a, which is used as a mask for forming the deeply doped source and drain region 113, is removed. In the embodiment, removal of the first disposable spacer 111a is performed by a wet etching method using hydrofluoric (HF) solution. In such a case, since an etching selectivity between the first disposable spacer 111a formed of silicon oxide ($SiO_2$) and the first dielectric layer 109 formed of silicon nitride ($Si_3N_4$) is high, the semiconductor substrate 101 located below the first dielectric layer 109 and underlying edges of the gate electrode 105 are not damaged.

Figure 10:
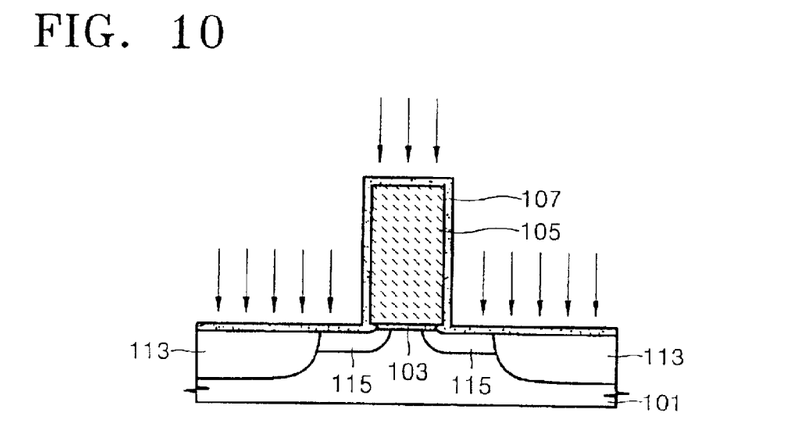

Referring to FIG. 10, the first dielectric layer 109 is removed by etching. In the embodiment, removal of the first dielectric layer 109 is performed by a wet etching method using phosphoric acid solution. When removing the first dielectric layer 109, an etching selectivity between the first dielectric layer 109 formed of silicon nitride ($Si_3N_4$) and the buffer dielectric layer 107 formed of silicon oxide ($SiO_2$) is high at 40:1 and thus, the semiconductor substrate 101 located below the first dielectric layer 109 and underlying edges of the gate electrode 105 are not damaged. In such a case, only the buffer dielectric layer 107 is formed on the semiconductor substrate 101 and the gate electrode 105.

Subsequently, after impurities with low energy are implanted in the entire surface of the semiconductor substrate 101 on which the buffer dielectric layer 107 is formed, an annealing process is performed so as to activate the implanted impurities. The implanted impurities are P-type impurities or N-type impurities. The annealing process is performed at a low temperature of 500–800° C., or by a rapid thermal annealing method or a spike thermal annealing method at a temperature of 900–1300° C. The spike thermal annealing method is a method for thermal annealing at the temperature of a thermal annealing furnace for a few seconds after raising the temperature of the thermal annealing furnace faster than the rapid thermal annealing method, for example, at 200° C. per second. In such a case, a shallowly doped source and drain region 115 is formed on the semiconductor substrate 101 at both sides of the gate electrode 105 adjacent to the deeply doped source and drain region 113. As described previously, the shallowly doped source and drain region, that is, the source and drain extension 115, is formed on the semiconductor substrate 101 at both sides of the gate electrode 105 after the deeply doped source and drain region 113 is formed. As a result, a short channel effect in a highly integrated semiconductor device, which occurs when impurities are spread over the shallowly doped source and drain region 115, can be prevented.

In the embodiment, the annealing process for forming the shallowly doped source and drain region 115 is performed immediately after the implantation of impurities; however, it may be performed before the shallowly doped source and drain region 115 is formed. A process of slightly wet etching the buffer dielectric layer 107 to be thin may be further added so as to form a shallowly doped source and drain region before forming the shallowly doped source and drain region 115. Further, in the embodiment, the shallowly doped source and drain region 115 is formed by using an ion implantation method; however, it may be formed by a solid phase epitaxy method or a plasma doping method.

Figure 11:
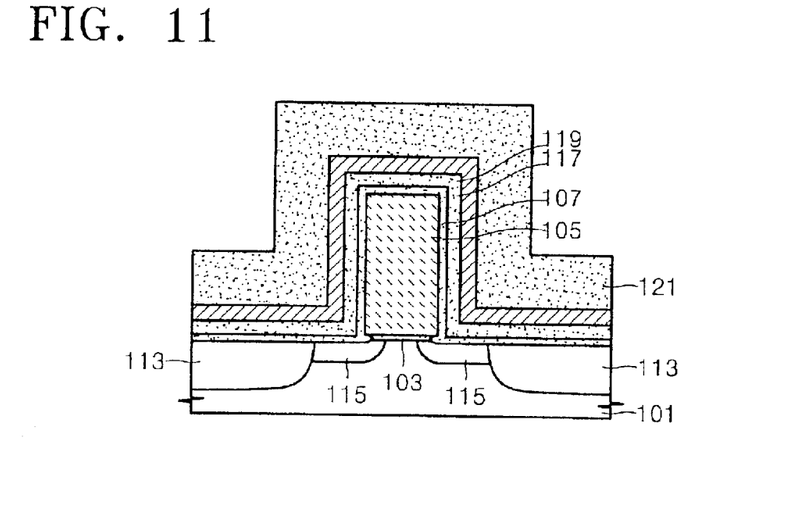

Referring to FIG. 11, a third dielectric layer 117 and a fourth dielectric layer 119 for forming a spacer are formed on the buffer dielectric layer 107. The fourth dielectric layer 109 is formed of a material having a high etching selectivity to the third dielectric layer 117. In the embodiment, the third dielectric layer 117 is formed of silicon oxide ($SiO_2$), and the fourth dielectric layer 119 is formed of silicon nitride ($Si_3N_4$). Preferably, the fourth dielectric layer 119 is thin so that overetching during an etching process after a subsequent spacer is formed can be prevented.

Subsequently, a fifth dielectric layer 121 for a suicide mask is formed on the fourth dielectric layer 119. The fifth dielectric layer 121 is formed of a material having a high etching selectivity to the fourth dielectric layer 119. In the embodiment, the fifth dielectric layer 121 is formed of silicon oxide ($SiO_2$). The length of a spacer during a subsequent process is finally determined by the thickness of the fifth dielectric layer 121.

Figure 12:
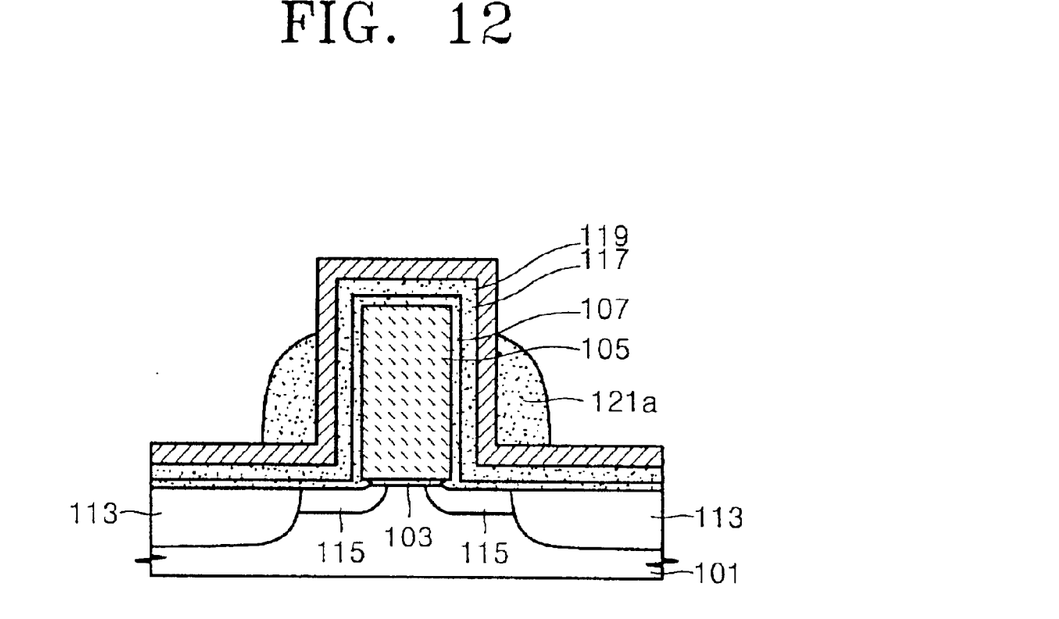

Referring to FIG. 12, the fifth dielectric layer 121 is dry etched to form a second disposable spacer 121a on the fourth dielectric layer 119 at both sidewalls of the gate electrode 105. Since the fifth dielectric layer 121 formed of silicon oxide ($SiO_2$) has a high etching selectivity to the fourth dielectric layer 119 formed of silicon nitride ($Si_3N_4$), etching of the fifth dielectric layer 121 stops at the fourth dielectric layer 119 during dry etching of the fifth dielectric layer 121.

Figure 13:
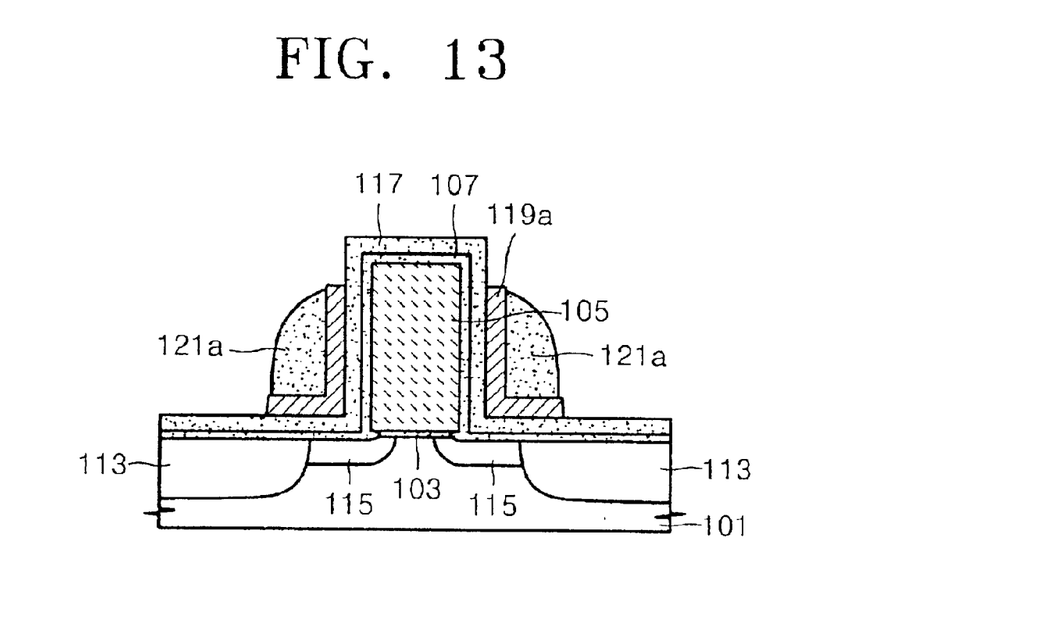

Referring to FIG. 13, in order to form silicide during a subsequent process, the fourth dielectric layer 119 formed on the third dielectric layer 117 on the gate electrode 105 and on the semiconductor substrate 101 is etched to form a fourth dielectric layer pattern 119a. In the embodiment, etching of the fourth dielectric layer 119 is performed by a wet etching method using phosphoric acid solution. When etching the fourth dielectric layer 119, the fourth dielectric layer 119 formed of silicon nitride ($Si_3N_4$) has a high etching selectivity of 40:1 to the third dielectric layer 117 formed of silicon oxide ($SiO_2$), and etching of the fourth dielectric layer 119 stops at the third dielectric layer 117.

Figure 14:
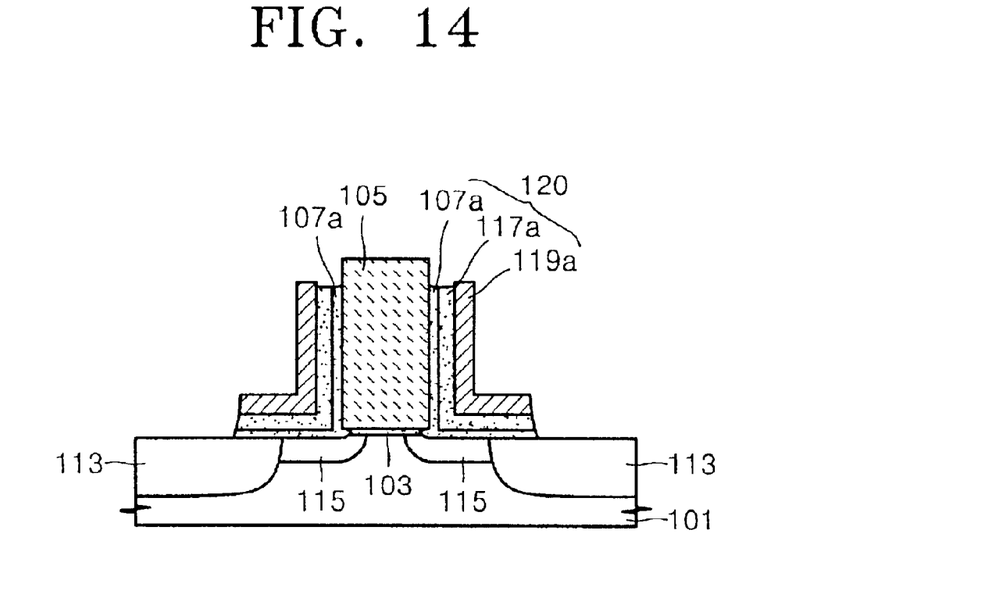

Referring to FIG. 14, in order to form silicide during a subsequent process, the buffer dielectric layer 107 and the third dielectric layer 117 on the gate electrode 105 and on the semiconductor substrate 101 are etched to form a buffer dielectric layer pattern 107a and a third dielectric layer pattern 117a. At this time, a second disposable spacer 121a is removed. Needless to say, part of the second disposable spacer 121a may remain. In the embodiment, etching of the buffer dielectric layer 107 and the third dielectric layer 117 is performed by a wet etching method using phosphoric acid solution. In such a case, an L-shaped spacer 120 comprised of the buffer dielectric layer pattern 107a, the third dielectric layer pattern 117a, and the fourth dielectric layer pattern 119a is formed at both sidewalls of the gate electrode 105.

An upper portion of the gate electrode 105 and the deeply doped source and drain region 113 are exposed, and the distance from the sidewalls of the gate electrode 105 to a metal silicide is determined by the length of the L-shaped spacer 120.

Figure 15:
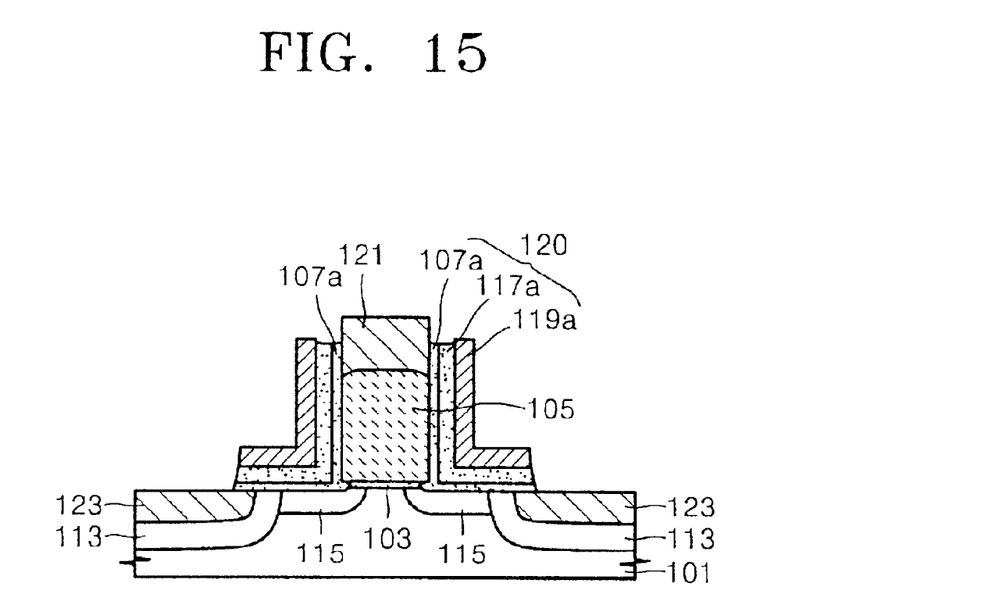

Referring to FIG. 15, a metal silicide 123 is formed on top of the gate electrode 105 and on the deeply doped source and drain region 113 so as to form a low resistance contact. The metal silicide 123 is formed of cobalt silicide, nickel silicide, or titanium silicide. Since the spacer of the present invention is an L-shaped spacer 120, the exposed area of the upper portion of the gate electrode 105 is increased, and the area of the metal silicide 123 is accordingly increased, thereby lowering the resistance of the gate electrode 105. Further, according to the present invention, the metal silicide is formed only on the deeply doped source and drain region 113, thereby reducing leakage current.

As described above, the present invention has disposable spacers, thereby forming the deeply doped source and drain region before forming the shallowly doped source and drain region. Further, the spacer of the present invention is an L-shaped spacer, thereby lowering the resistance of the gate electrode and reducing leakage current. In particular, the deeply doped source and drain region is formed before the shallowly doped source and drain region is formed, thereby effectively suppressing a short channel effect in a highly integrated semiconductor device.

What is claimed is:

1. A method of fabricating a semiconductor device, the method comprising:
    forming a gate dielectric layer and a gate electrode on a semiconductor substrate;
    sequentially forming a buffer dielectric layer, a first dielectric layer, and a second dielectric layer on the surface of the gate electrode and on the semiconductor substrate;
    etching the second dielectric layer to form a first disposable spacer on the first dielectric layer at both sidewalls of the gate electrode;
    forming a deeply doped source and drain region on the semiconductor substrate to be aligned to the first disposable spacer;
    sequentially removing th first disposable spacer and the first dielectric layer;
    forming a shallowly doped source and drain region on the semiconductor substrate at both sidewalls of the gate electrode adjacent to the deeply doped source and drain region;
    sequentially forming a third dielectric layer, a fourth dielectric layer, and a fifth dielectric layer on the buffer dielectric layer;
    etching the fifth dielectric layer to form a second disposable spacer on the fourth dielectric layer at both sidewalls of the gate electrode;
    etching the fourth dielectric layer, the third dielectric layer, and the buffer dielectric layer to form an L-shaped spacer at both sidewalls of the gate electrode; and
    forming a metal silicide on top of the gate electrode and on the deeply doped source and drain region.

2. The method of claim 1, wherein the second dielectric layer is formed of a layer having a comparatively higher etching selectivity than the first dielectric layer.

3. The method of claim 2, wherein the second dielectric layer is formed of silicon oxide ($SiO_2$), and the first dielectric layer is formed of silicon nitride ($Si_3N_4$).

4. The method of claim 1, wherein the first dielectric layer is formed of a layer having a comparatively higher etching selectivity than the buffer dielectric layer.

5. The method of claim 4, wherein the first dielectric layer is formed of silicon nitride ($Si_3N_4$), and the buffer dielectric layer is formed of silicon oxide ($SiO_2$).

6. The method of claim 1, wherein the deeply doped source and drain region is formed by performing a step of implanting impurities into the surface of the semiconductor substrate on which the buffer dielectric is formed by using the first disposable spacer as a mask and a step of annealing the implanted impurities.

7. The method of claim 6, wherein the step of annealing to form the deeply doped source and drain region is performed before the step of forming the shallowly doped source and drain region.

8. The method of claim 1, wherein the shallowly doped source and drain region is formed by performing a step of implanting impurities in the surface of the semiconductor substrate, on which the buffer dielectric layer is formed, and a step of annealing the implanted impurities.

9. The method of claim 8, wherein the step of annealing to form the shallowly doped source and drain region is performed before the step of forming the metal silicide.

10. The method of claim 8, wherein the step of annealing to form the shallowly doped source and drain region is performed at a low temperature of about 500–800° C.

11. The method of claim 8, wherein the step of annealing to form the shallowly doped source and drain region is performed by a step of rapid thermal annealing.

12. The method of claim 8, wherein the step of annealing to form the shallowly doped source and drain region performed by a step of spike thermal annealing at a temperature of about 900–1300° C.

13. The method of claim 1, wherein the fifth dielectric layer is formed of a layer having a comparatively higher etching selectivity than the fourth dielectric layer.

14. The method of claim 13, wherein the fifth dielectric layer is formed of silicon oxide ($SiO_2$), and the fourth dielectric layer is formed of silicon nitride ($Si_3N_4$).

15. The method of claim 1, wherein the distance from the sidewalls of the gate electrode to the deeply doped source and drain region is determined by the length of the first disposable spacer, and the distance from the sidewalls of the gate electrode to the metal silicide is determined by the length of the L-shaped spacer.

16. The method of claim 1, wherein the L-shaped spacer is formed by performing a step of etching the fourth dielectric layer exposed by the second disposable spacer and a step of etching the buffer dielectric layer and the third dielectric layer exposed by the etched fourth dielectric layer.

17. The method of claim 16, wherein the fourth dielectric layer is formed of a layer having a comparatively higher etching selectivity than the third dielectric layer.

18. The method of claim 17, wherein the fourth dielectric layer is formed of silicon nitride ($Si_3N_4$), and the third dielectric layer is formed of silicon oxide ($SiO_2$).

19. The method of claim 16, wherein the third dielectric layer and the buffer dielectric layer are formed silicon oxide ($SiO_2$).

20. The method of claim 1, wherein the shallowly doped source and drain region is formed by ion implantation.

21. The method of claim 1, wherein the shallowly doped source and drain region is formed by solid phase epitaxy.

22. The method of claim 1, wherein the shallowly doped source and drain region is formed by plasma doping.

* * * * *